United States Patent [19]

Gaubatz

[11] Patent Number: 4,949,362
[45] Date of Patent: Aug. 14, 1990

[54] SYSTEM FOR DETECTING AND LIMITING ELECTRICAL GROUND FAULTS WITHIN ELECTRICAL DEVICES

[75] Inventor: Donald C. Gaubatz, Cupertino, Calif.

[73] Assignee: General Electric Company, San Jose, Calif.

[21] Appl. No.: 321,232

[22] Filed: Mar. 9, 1989

[51] Int. Cl.$^5$ .............................................. G21C 17/00
[52] U.S. Cl. ...................................... 376/259; 361/48; 376/277
[58] Field of Search ............... 376/259, 245, 277, 404, 376/405, 406; 361/48, 31

[56] References Cited

U.S. PATENT DOCUMENTS

| | | | |
|---|---|---|---|
| 3,492,533 | 1/1970 | Thurston | 361/48 |
| 3,928,975 | 12/1975 | Braytenbah | 376/297 |
| 4,021,700 | 5/1977 | Ellis-Anwyl | 361/31 |
| 4,434,390 | 2/1984 | Elms | 318/798 |

*Primary Examiner*—Daniel Wasil
*Attorney, Agent, or Firm*—Robert R. Schroeder

[57] ABSTRACT

An electrical ground fault detection and limitation system for employment with a nuclear reactor utilizing a liquid metal coolant. Elongate electromagnetic pumps submerged within the liquid metal coolant and electrical support equipment experiencing an insulation breakdown occasion the development of electrical ground fault current. Without some form of detection and control, these currents may build to damaging power levels to expose the pump drive components to liquid metal coolant such as sodium with resultant undesirable secondary effects. Such electrical ground fault currents are detected and controlled through the employment of an isolated power input to the pumps and with the use of a ground fault control conductor providing a direct return path from the affected components to the power source. By incorporating a resistance arrangement with the ground fault control conductor, the amount of fault current permitted to flow may be regulated to the extent that the reactor may remain in operation until maintenance may be performed, notwithstanding the existence of the fault. Monitors such as synchronous demodulators may be employed to identify and evaluate fault currents for each phase of a polyphase power, and control input to the submerged pump and associated support equipment.

17 Claims, 6 Drawing Sheets

SYSTEM FOR DETECTING AND LIMITING ELECTRICAL GROUND FAULTS WITHIN ELECTRICAL DEVICES

The government has rights in this invention under Contract No. DE-A CO3-88SF17467.

BACKGROUND OF THE INVENTION

Nuclear power plants traditionally have been designed under criteria mandating safe and reliable performance. Such design criteria have confronted investigators with a broad variety of technical challenges which, in the past, have led to stringent and complex active safety systems, in turn leading to increased plant costs, stretched plant construction schedules, and complex licensing requirements. In consequence the power generating industry has experienced a cost escalation rendering alternative power generation approaches more palatable to the power industry.

Over the recent past, however, investigators have addressed these constraints and have looked to a somewhat standardized reactor module which performs within a limited and well defined safety envelope. The result has been the promise for operational attributes providing an inherently safe and passive decay heat removal, factory fabrication, and more economical erection of reactor facilities, the modularization resulting in a smaller reactor size which permits incremental development of reactor sites. The product of this approach has been termed a "Power Reactor Inherently Safe Module" sometimes referred to as PRISM. This modular reactor development involves a fast breeder (FBR) architecture wherein the reactor core is submerged within a reactor vessel containing a liquid metal such as sodium. Also contained within the confining reactor vessel are two intermediate heat exchangers (IHX) carrying out a heat exchange function between the primary liquid sodium of the reactor and a secondary liquid sodium system leading out of the reactor for secondary heat exchange ultimately developing steam derived power.

To circulate primary liquid sodium about the reactor core and the intermediate heat exchanger, a high capacity electromagnetic pump also is submerged within this liquid metal medium. Structured in the manner of a linear motor, the electromagnetic pump has no moving parts, taking advantage of the response capability of the primary sodium to electromagnetic flux influence. Generally, four cartridge-type electromagnetic pumps are employed with this compact pool type reactor and the primary radioactive system is hermetically sealed. When an associated steam turbine, driven from the reactor generated power, is unavailable due to maintenance and the like, decay heat from the reactor is rejected to a condenser. Should the condenser or feed water systems not be available, decay heat is rejected by opening air louvres in a shroud about the steam generator. The natural convection of air over the steam generator shell will cool the reactor module to stand-by conditions in a relatively minimal period of time, for example, two days. Additionally, because of the modular reactor's relatively smaller size, a passive back-up decay heat removal is provided by a radiant reactor vessel auxiliary cooling system (RVACS). Operation is continuous and air movement is by passive convective air current. The core of the reactor is designed to produce only as much heat as is removed. Accordingly, should a downstream heat exchange to steam be terminated for any reason, the reactor system may shut down with no significant safety related concern.

Because of the circulation capacity required of the submerged electromagnetic pumps, a substantial amount of power is called for, i.e. in excess of a megawatt. An electromagnetic pump of this size is a highly inductive component with a lagging power factor of 0.4 to 0.6. For efficiency and compatibility with the solid state power conditioning unit, the power factor must be corrected. One advantageous approach to power factor correction resides in the utilization of a synchronous machine connected in parallel with each of the submerged electromagnetic pumps. Such devices will interject a capacitive term to the electrical power system to effect such correction. For the instant application, an added advantage accrues with the utilization of such synchronous machines. In this regard, in the event of a safety related form of reactor shut-down involving the termination of electrical power, i.e. a scram condition or the like, it will be necessary to provide a continuum of controlled coolant pumping for a limited interval, for example 200 seconds or more, in order to accommodate or remove latent heat from the reactor core. Otherwise, localized boiling with the potential for localized fuel melting may be encountered. By incorporating a flywheel exhibiting sufficient inertial attributes with the synchronous machine, power for this limited interval coastdown becomes readily available. Thus, under abnormal or reactor scram conditions wherein power is suddenly removed from the electromagnetic pumps and associated synchronous machines, the synchronous machines will provide inertially generated electrical power to the pumps such that the thermal power-to-primary coolant flow ratio is appropriately maintained as the reactor commences to cool.

While the electromagnetic pumps employed with the reactor exhibit the advantages of having no moving parts and, inasmuch as they are installed directly within the reactor, no primary fluid is required to leave the vessel. To add assurance to the noted benign performance of the modular reactor power systems, it is desirable to provide a design accommodation to a possibility for certain ground fault conditions which might be developed at the pumps. These linear pumps generally are fashioned as a sequence of electromagnetic coils which are located under an inert atmosphere within a protective shell or sheath fashioned, for instance of stainless steel. Should the insulating architecture of the structure surrounding the coils fail at one position or another, then a single point fault induced current can develop between a given coil or coils and the metallic shell which may cause development of an arc potentially exposing the electromagnetic components of the pump to liquid sodium. In addition to potential secondary reactions, this liquid metal coolant may be carrying nuclear particles from a failed fuel pin within the reactor. It therefore becomes incumbent to provide a design by which such an excursion cannot occur and which addresses the overall design critiera for the modular reactors calling for an inherency of reliability and safety. Accordingly, should such a fault condition occur within one of the pumps, then the fault should be contained in a manner wherein safe operation is maintained and the reactor may continue to perform in a safe manner by virtue of its redundant structuring. Further, the occasion of such a fault, albeit controlled, should be the subject of astute monitoring and analysis on the part of plant operating personnel. Such control over ground faults further should be applied with respect to the noted synchronous machine, as well as to the housings of associated, isolated power supplies and conditioners.

SUMMARY

The present invention is addressed to an electrical fault control and monitoring system, apparatus, and method for employment with a nuclear reactor of a variety utilizing electromagnetic pumps for circulating liquid metal coolant. With the system, those single point faults which may develop due to insulation breakdown or the like leading to contact between one or more of the inductive or flux generating components of the submerged pump with the conductive walls enclosing them are controlled and constrained to predetermined acceptable fault current levels. This control is achieved through an arragement providing for the isolation of the power and control input or source to the electromagnetic pump from the a.c. plant power input to the system, and the provision of a dedicated or specific fault control conductor extending as a return from each fault deriving pump drive enclosure implement to the source. By incorporating a resistor arrangement at a predetermined impedance value with this fault control conductor, the corresponding values of any fault currents which may be encountered are accurately controlled. With control over fault current generation, continued operation of the affected reactor may be provided under controlled, safe conditions until such time as maintenance procedures may be undertaken.

Inasmuch as the fault controlling resistor components will exhibit voltage values corresponding with the overall fault current of a polyphase pump powering input, the monitoring, not only of overall fault current, but also discrete phase designated fault currents readily may be provided. Thus, plant operating personnel may be continuously apprised of any ongoing fault activity within the submerged coolant pumping system.

For reactor plant designs wherein the submerged electromagnetic pump is powered in parallel with an idling synchronous machine for power factor correction and coast down pump operations upon power cutoff, an assurance against current fault feed also is provided, inasmuch as no return to the synchronous machine exists from the pump environment. Accordingly, all energy generated by the synchronous machine will be used for the support of the flow coast down operation as opposed to fault feeding activity.

As another feature, the invention is concerned with a system for controlling what may be termed single point electrical fault at an electromagnetic pump employed within a nuclear power plant of a variety wherein a reactor is provided including a reactor vessel containing a liquid metal coolant, a reactor core and a noted polyphase, electromagnetic pump having selectively excitable flux generating components insulatively enclosed within the walls of an enclosure, an a.c. plant power supply, means defining a facility ground, a plant control system, and a reactor protection system for effecting safety related control over the reactor. The system is seen to include a power source inductively coupled with the plant power supply for deriving an electrically insulative electrical power source. A controller is coupled with the isolated electrical power source for providing select phase outputs effecting polyphase energization of the flux generating components of the pump. A fault control conductor is coupled between the pump and the isolated electrical power source for providing a fault current return thereto in the presence of a single point fault between a flux generating component of the pump and the enclosure wall. Finally, a current limiting resistor is coupled intermediate the fault control conductor and the isolated electrical power source which has an impedance of value selected to limit the fault current to a predetermined value selected to assure the integrity of the enclosure walls.

Another feature of the invention provides, in a nuclear power plant of a variety wherein a reactor is provided including a reactor vessel retaining a liquid metal coolant, a reactor core, and a polyphase electromagnetic liquid metal circulating pump submerged within the liquid metal, the pump having energizable flux generating components insulatively enclosed within the walls of a protective chamber, an a.c. plant power supply, a facility ground, a synchronous machine electrically coupled in parallel relationship with the pump and including the rotation sustaining inertial device, a controller energized from the power supply for effecting polyphase energization of the flux generating components, and the simultaneous parallel energization of the synchronous machine, a plant control system controlling the controller and a reactor protection system for effecting safety related control over the reactor, the fault control circuit which comprises an isolation transformer coupled intermediate the a.c. plant power supply and the controller for providing electrically isolated power source to the controller. The controller comprises a rectifier for deriving a d.c. output and an inverter under the control of the plant control system for converting the d.c. output to a select polyphase a.c. output for energizing the pump flux generating components and the synchronous machine. A fault control conductor is coupled between the pump and the electrically isolated power source for providing fault current return thereto from the pump.

Another feature of the invention provides, in a nuclear power plant of a variety wherein a reactor is provided including a reactor vessel retaining a liquid metal coolant, a reactor core and an electromagnetic pump having a plurality of inductive windings insulatively retained within the electrically conductive wall of an enclosure, an arrangement defining the facility ground, an a.c. plant power supply and a plant control system, the method for controlling single point fault current between an inductive winding and the exclusive walls comprising the steps of:

providing an electrically isolated power source by inductive coupling with the plant power supply;

rectifying the power source to provide an isolated d.c. power source;

providing an inverter powered from the isolated d.c. power source under the control of the plant control system for selectively energizing the inductive winding;

providing a fault control conductor electrically connected with the pump enclosure wall and assuring an electrical return for fault current to the isolated d.c. power source; and providing an electrical resistance between the conductor and the isolated d.c. power source having an impedance selected to limit the fault current below a predetermined value preventing arc damage at any ground fault location.

Other objects of the invention will, in part, be obvious and will, in part, appear hereinafter. The invention, accordingly, comprises the apparatus, method and system possessing the construction, combination of elements, arrangement of parts, and steps which are exemplified in the following detailed disclosure. For a fuller understanding of the nature and objects of the invention, reference should be had to the following detailed description taken in conjunction with the accompanying drawings.

BRIEF DESCRIPTION OF THE DRAWINGS

FIGS. 4 and 4A combine to describe an energization and control system employed with the reactor of FIG. 1;

DETAILED DESCRIPTION OF THE INVENTION

A power plant facility within which the present system may be employed utilizes a sodium cooled modular form of pool reactor of any size, for example, corresponding to about 138 MWe. Combined with its steam generator, each of these modular reactors can be installed in standardized multiple blocks to provide a range of power plant sizes. While employing conventional shut-down and decay heat removal systems for normal and upset conditions, the modular approach also provides an inherent core shut-down and passive decay heat removal approach. Each power block of an installed plant may include, for example, three reactor modules, a sodium heated steam generator for each reactor module, and a turbine generator to which all three steam generators in the power block are connected. All nuclear safety related systems and buildings are enclosed within a secure area and the remainder of the facility, being designated non-nuclear or non-safety related, includes steam generators, control room, turbine generators and associated structures are separately designated.

Figure 1:
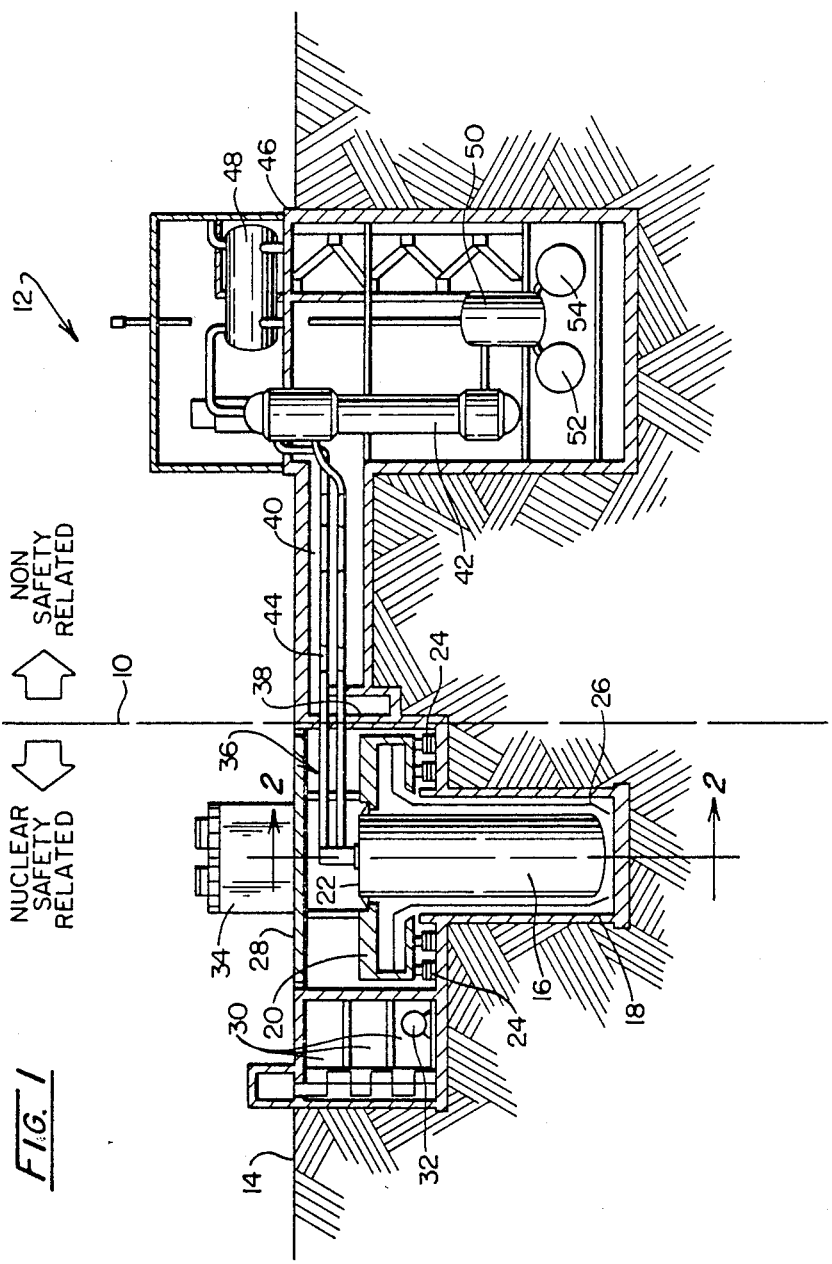
FIG. 1 is a sectional schematic view of a nuclear power plant which may incorporate the features of the instant invention.

Referring to FIG. 1, the separation between the nuclear safety related and non-safety related components for a module are represented by the dashed boundary 10 of a schematic portrayed of a reactor-steam generation module shown generally at 12. Located below the terrestrial surface 14, the reactor module is represented at 16 positioned within a reinforced concrete silo wall 18. Suspension of the reactor 16 within the silo walls 18 is by a reinforced concrete reactor support structure 20 supporting the reactor 16 at the upper closure portion 22 thereof. Support structure 20, in turn, is retained upon seismic isolators as at 24. Additionally positioned within the assemblage is a collector cylinder 26 for air flow direction. A reinforced concrete roof or cover 28 is positioned at ground level over the reactor assembly and adjacent thereto to one side of the arrangement is an equipment vault 30 retaining, for example, a synchronous machine 32. Stacks for the reactor vessel auxiliary cooling system (RVACS) are represented at 34. Intermediate heat transfer (IHTS) piping as well as steam generator equipment are also positioned below grade within guard piping and the like as are represented in general at 36 passing a safety wall 38 and thence through a pipe tunnel 40 to a steam generator 42. Seismic protection through employment, for example, of gimballed pipe joints additionally may be provided as are represented schematically at 44. Steam generator 42 may be provided as a vertical straight shell and tube heat exchanger positioned within a semi-subterrestial facility 46 within the non-safety related region of the module 12. Heat exchanger 42 performs, for example, in conjunction with such components as a steam drum 48, relief tank 50, and sodium drain tanks 52 and 54.

Figure 2:
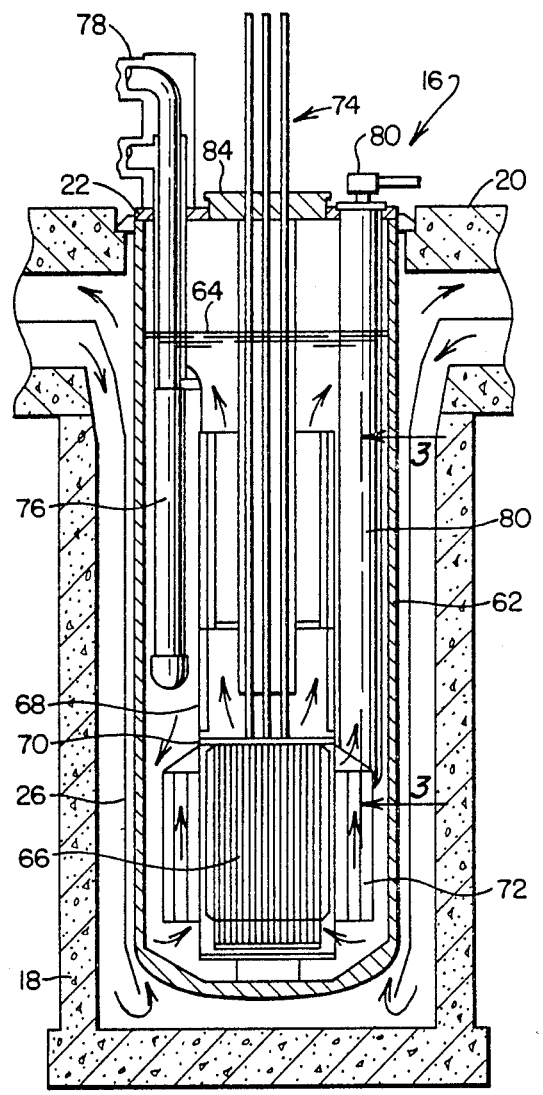
FIG. 2 is a sectional view of a reactor taken through the plane 2—2 in FIG. 1.

Turning to FIG. 2, reactor 16 is represented at a higher level of detail. In the figure, the reactor vessel is shown at 62 retaining a pool of sodium having a level at 64 within which is retained a reactor core 66 within a support cylinder 68. The reactor core 66 is retained within a core barrel 70 about which is positioned fixed sheilding 72 and above which are located control drive assemblies represented generally at 74. One intermediate heat exchanger (IHX) is shown at 76 having secondary liquid sodium output ports 78 and one of four electromagnetic pumps is represented at 80 having control and powering conduits exiting from the cover region 22 at 82. A rotatable plug or cover is shown enclosing the reactor at 84.

When the turbine driven by the system is unavailable, reactor decay heat normally is transferred to a condenser through a by-pass line. For occasions, such as maintenance operations, which may arise when this path is not available, decay heat can be removed by natural convection air cooling of the steam generator shell using an auxiliary cooling system (ACS). In the unlikely event that cooling of the reactor module by the intermediate heat transfer system (IHTS) is not available, a passive reactor auxiliary cooling system (RVACS) is available. The heat flow path for RVACS is convection from the sodium to the reactor vessel (which may be by natural circulation), thermal radiation across an inert gas filled gap between the reactor vessel and the containment vessel (not shown) and a combination of thermal radiation and convection to ducted natural circulation air flowing upward around the outside of the containment vessel. Air inlets and exhaust for the RVACS system are through the noted stacks 34 (FIG. 1).

Figure 3:
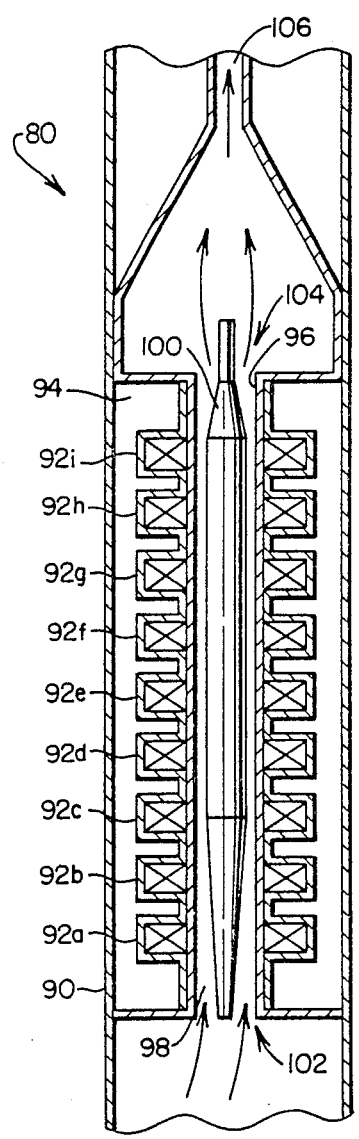
FIG. 3 is a partial sectional view of an electromagnetic pump taken through the plane 3—3 in FIG. 2.

Referring to FIG. 3, a schematic representation of the electromagnetic pump 80 is revealed. Pump 80 includes a cylindrical outer housing 90 within which is located a polyphase sequence of inductive windings or flux generating components certain of which are shown at 92a–92i. Components 92a–92i, in turn, are retained within an annulus shaped chamber 94 having a cylindrically shaped inner wall 96 defining a cylindrical passage 98. The windings 92a–92i are retained within an inert gas atmosphere and are insulatively supported within chamber 94. Generally, the walls as at 96 and the like are formed of a non-magnetic material such as stainless steel. Within the passageway 98, there is provided an iron or suitable magnetic material core 100 about which liquid sodium may be driven somewhat in the manner of a polyphase or three phase linear electric motor. The inlet to passageway 98 is represented at 102 while the outlet thereof is shown at 104 extending to an exit conduit 106.

With the arrangement shown, it may be noted that the inductive windings or "stator" winding 92a–92i of the pump 80 are in close proximity with the inner wall 96 or duct carrying liquid metal. Thus, there exists a concern that any electrical insulation breakdown may lead to a short circuit ground fault to the duct wall or inner wall 96. Such a fault may result in a high energy electrical arc which could rapidly burn through the wall 96 to permit ingress liquid metal and evoke undesirable secondary reactions. This type fault may be termed "single fault", however, it may, for example, be manifested as multiple failures within one component of the pump. A condition permitting a high energy arc is especially undesirable when a liquid metal such as sodium is the primary coolant. For example, the liquid metal coolant may be carrying nuclear particles from a failed fuel pin within the reactor. Thus, some arrangement must be provided to rapidly detect a fault of this type and limit the consequences of such an electrical short circuit to ground. Generally speaking, all of the components of the facility within the safety related area are coupled to a facility electrical ground, the path of which is somewhat nebulous to trace.

Figure 4:
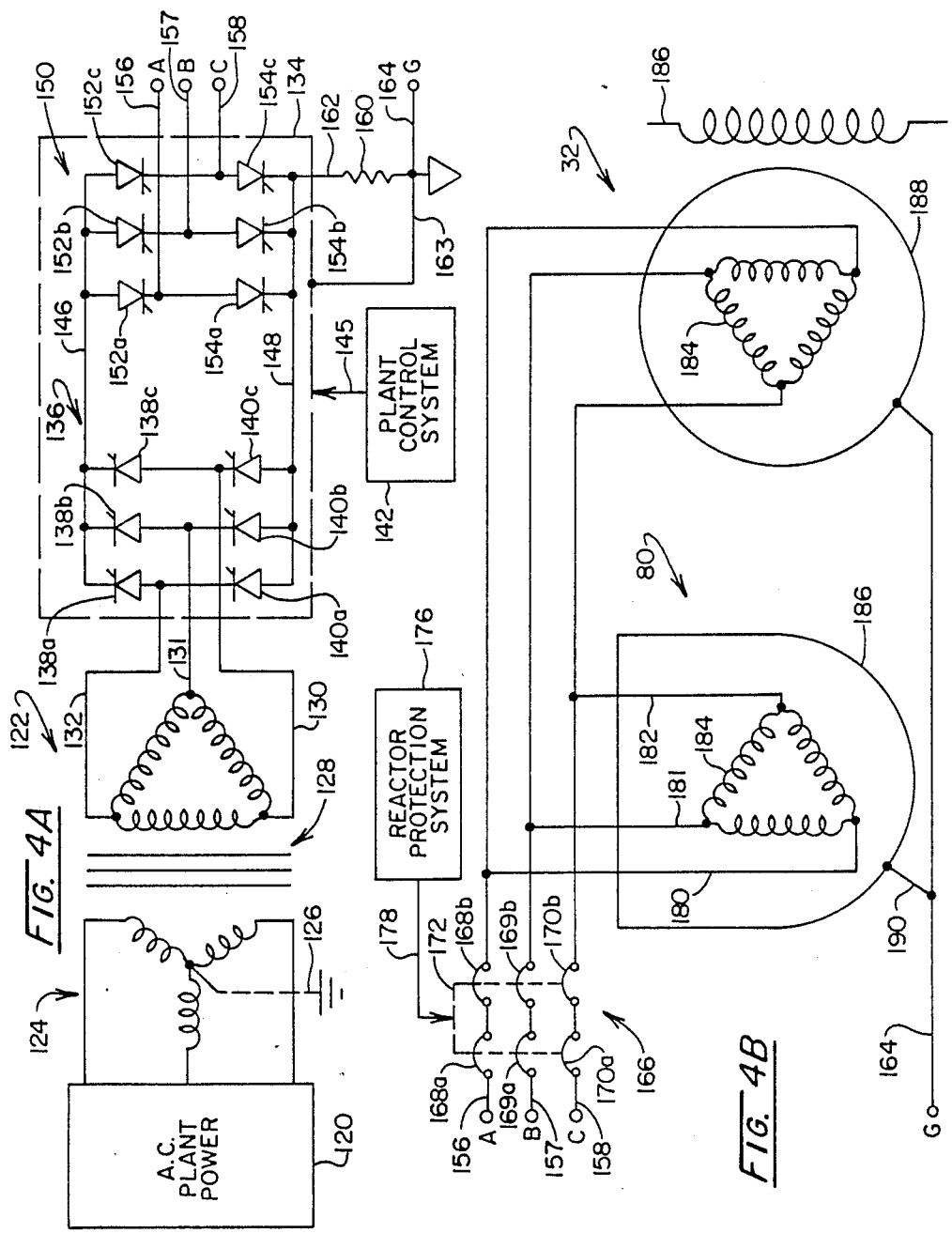

Referring to FIGS. 4A and 4B, a generalized and schematic representation of the power and control inputs to the reactor module is revealed. In the figures, FIG. 4A represents components within non-safety related regions of a facility as discussed in conjunction with the boundary 10 in FIG. 1, while FIG. 4B relates to components within the safety related region. In the figure, a.c. plant power which may be developed from an off-site source or, from main turbine generators of the facility itself is represented at block 120. This source avails, for example, a 7.2 kilovolt power input at 60 Hz for the operation of the primary heat transport system. The power input represented at block 120 is electrically isolated by an isolation arrangement represented in general at 122 which is shown to include a wye primary winding side 124 the center position of which may be coupled as represented by dashed ground line 126 to facility ground. The secondary side of the arrangement 122 is shown as a delta winding 128 providing a step-down three-phase electromagnetic pump operating voltage at approximately 600 volts. Either wye or delta configurations may be employed as windings 124 or 128. In addition to stepping the voltage level down, the transforming function 122 serves to provide an electrical isolation such that the pump control and operational circuitry may perform with a carefully selected and defined electrical return or dedicated ground.

The three outputs represented at lines 130–132 which are combined with a safety ground, are directed to a power conditioning or converting function represented within dashed boundary 134 which also represents a frame. This conditioner arrangement 134 includes an initial rectifier-filter stage represented in general and schematically at 136 as an array of silicon controlled rectifiers (SCRs) 138a–138c and 140a–140c. The gate inputs to these SCRs are controlled from a plant control system (PCS) as represented by block 142 and arrow 145. The result of the rectification stage 136 is a d.c. output at d.c. buses 146 and 148. Bus components 146 and 148 are seen directed to a d.c. to a.c. inverter represented generally at 150. Inverter 150 is configured in typical fashion and includes an array of SCRs 152a–152c and 154a–154c, the gate inputs to which are controlled from the earlier-noted plant control system (PCS) 142. Control outputs for driving both the electromagnetic pump 80 and synchronous machine 32 are provided at phase A, B, and C outputs shown, respectively, at lines 156–158. In general, the control asserted from inverter 150 and PCS 142 carries out a switching routine at voltage frequencies between about 5 and 25 Hz to derive pressure and flow control at the pump 80. Additionally positioned at the conditioner location 134 is a current limiting resistor function 160 shown coupled within line 162 between d.c. bus 148 and facility ground. Leading to resistor 160 and thus as a return to bus 148 of the conditioner 134, is a fault control conductor represented at line 164 and labelled "G". The containment devices for conditioner function 134 also are coupled to facility ground as represented by line 163. Similarly, the core components of transformer 127 may be connected to facility ground.

Control and power lines 156–158 as well as fault control conductor 164 cross the safety related boundary for purposes of providing control and power to pump 80 and synchronous machine 32. Accordingly, referring to FIG. 4B, lines 156–158 carrying phase A, B, and C power and control are directed through an array of circuit breakers represented generally at 166, provided in redundant or dual fashion and shown at 168a–168b through 170a–170b. Actuating input to these circuit breakers is represented by dashed line 172, such control and the devices themselves being configured under safety related or electrical class 1E criteria. Control of the actuation of the circuit breaker array 168 is by the reactor protection system (RPS) as represented by block 176 and arrow 178.

From the opposite side of circuit breaker array 166, lines 156–158 are seen to be tapped by respective control and powering leads 180–182 which are directed to the inductive components 92a–92i (FIG. 3) of the electro-magnetic pump 80. The latter polyphase control to these inductive windings is shown by coupling to a delta depicted winding 184. The conductive housing components of the pump 80 including, for example, the wall components 96 as well as housing components 90 are represented at 186. Lines 156–158 additionally are seen to be directed to the stator winding of synchronous machine 32 here shown as a delta connected inductive system 184. The shaft mounted inductive components of the synchronous machine 32 are represented schematically by winding 186, while the conductive outer housing of the device is represented at 188. Thus configured, it may be observed that the synchronous machine is connected in parallel with the electromagnetic pump 80. Further, fault control conductor 164 is seen to be directly coupled both to the housing 188 of synchronous machine 32 and, as represented by line 190 to the conductive housing components 186 of electromagnetic pump 80. While not shown, conductor 164 also may be coupled to the electrically conductive frame of breaker array 166.

Synchronous machine 32 performs two functions within the system at hand. During normal operation the device is operated in an idling fashion in parallel with the pump 80, consuming sufficient power only to maintain its rotation along with an associated inertial device such as a flywheel. This functions to insert a lead capacitive term into the powering system to provide a power factor correction. Its excitation produces a leading power factor correction to compensate for the lagging power factor of electromagnetic pump 80. In this regard, the machine 32 generates a voltage of proper phase and amplitude under the control of a regulator to correct power factor. In the event of the assertion of a safety control through the reactor protection system (RPS) and consequent opening of breaker array 166, the machine 32 will continue operation under the drive of the inertial device for an interval sufficient to carry out coast down control and powering of the pump 80.

Figure 5:
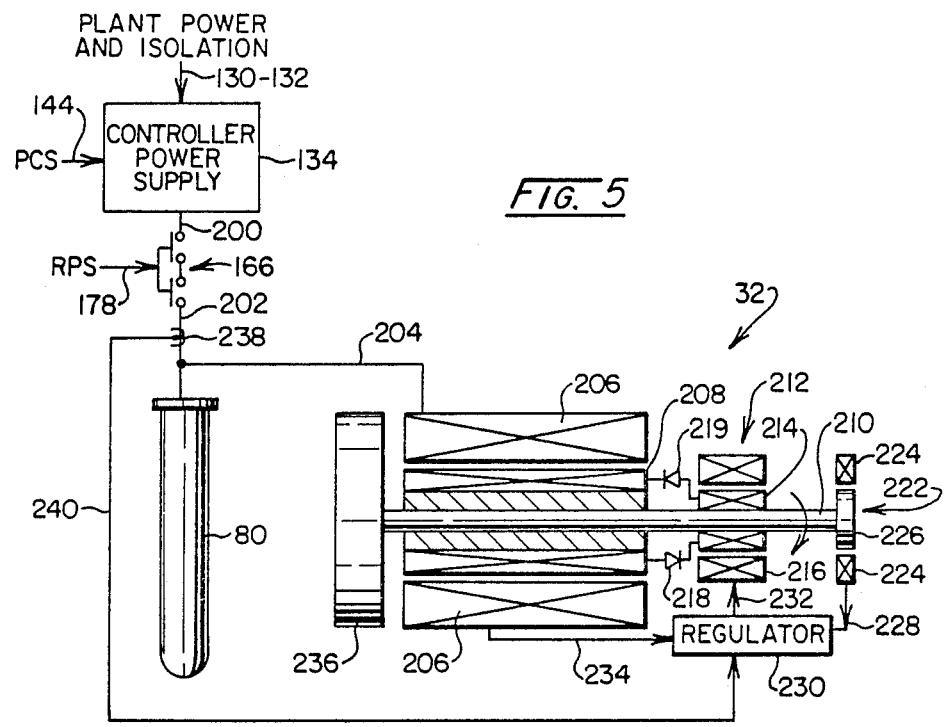
FIG. 5 is a schematic and partially sectional view of a synchronous machine employed with the control arrangement of FIGS. 4 and 4A.

Turning momentarily to FIG. 5, the arrangement of the synchronous machine 32 within the system at hand is additionally portrayed. In the figure, the plant power and isolation function is represented by an arrow labeled 130–132, while the controller-power supply block 134 is reproduced in conjunction with the plant control system (PCS) inputs again represented by arrow 144. The polyphase power and control output from the conditioner-power supply 134 is represented at line 200 extending through the earlier-noted circuit breaker array 166 shown under the control of the reactor power protection system again depicted by arrow 178. The polyphase control and power input then is shown as represented at line 202 as extending to the inductive components of electromagnetic pump 80 and via line 204 to the stator winding 206 of machine 32. In general, the synchronous machine 32 comprises two princpal components, a stator 206 and a rotor 208, the latter being mounted upon shaft 210. Typically, the rotor 208 consists of an even number of magnetic poles of alternating polarity, each pole having a field coil. A brushless a.c. exciter shown generally at 212 is depicted as comprised of shaft mounted pick-up coils 214 which derive an a.c. power input by inductive coupling with external windings 216. The resultant a.c. derived current is rectified as represented by diodes 218 and 219, and the resultant d.c. current is applied to the field windings of rotor 208. A pilot exciter is shown generally at 222 including a winding 224 and permanent magnet 226. The permanent magnet 226 is shaft mounted, and, during start-up, provides a power input as represented at line 228 to a regulator represented at block 230. Regulator 230 functions to control the synchronous machine 32 represented by arrow 232 extending to the winding 216 of exciter 212. Additional input from the stator winding to regulator 230 is represented by arrow 234. Shaft 210 also is seen to support an inertial device which may be provided as a flywheel 236. Regulator 230 also responds to the presence or absence of current within the polyphase power and control lines represented at 202 as depicted by a small current transformer symbol 238 and line-arrow 240.

Figure 6:
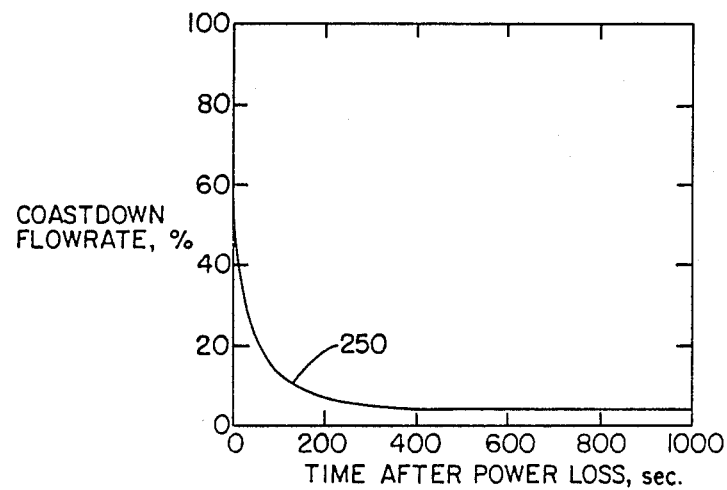
FIG. 6 is a curve plotting an appropriate coast down flow rate with time for a reactor and electromagnetic pump combination as described in conjunction with FIGS. 4 and 4A.

In the event of a condition resulting in loss of power to the electromagnetic pump 80 and, simultaneously to synchronous machine 32, the device 32, under the kinetic energy drive made available by the inertial device 236, will provide a controlled coast down power input to the pump 80 which is designed such that the thermal power to primary coolant flow ratio is appropriately maintained as the reactor 16 cools. Such flow coast down represents the rate of decrease of the primary coolant flow as a function of time. The condition will be initiated by a loss of current flow within the input cables or feed 202. This current loss may be occasioned, for example, due to loss of source power; a PCS command removing conditioner-power supply 134 output; a fault in the latter conditioner-power supply 134; or an RPS initiated scram sequence functioning to open the circuit breaker array 166. Upon the occurrence of such power loss, the regulator 230 is called upon to commence a coast down sequence. In this regard, a loss of power is sensed by the current transformer function 238 and is detected by regulator 230 as represented at line 240. Essentially immediately, the control drops the power input to the electro-magnetic pump 80 to achieve about a 60% flow rate. This initial controlled drop serves to avoid over-cooling and a thermal shock to the system at this point in time after power loss. The coast down program then continues the cooling procedure at a minimum stress rate. It may be observed that an inertially activated mechanical pump will initially over-cool such a system and subsequently under-cool it. However, requisite control readily is obtained with the present approach. Looking additionally to FIG. 6, a desired coast-down flow rate versus time following power loss is depicted by curve 250. The coast down period continues for at least 200 seconds and may extend beyond that period following which time the reactor 16 performs under natural circulation conditions as above discussed.

In accordance with the system of the present invention, the occurrence of an electrical ground fault at the inductive components 92a–29i (FIG. 3) of pump 80 is controlled to the extent that current of the fault will be constrained to a level such that it will be unable to provide sufficient energy for burn down or burn through its ducting. This controlled fault condition obtains whether the fault is energized from the normal power supply or from the synchronous machine 32 during coast down procedures. Looking to FIGS. 4B and 7, it may be observed that fault control conductor 164 extends both from the electromagnetic pump 80 and from the synchronous machine 188 to provide a return path through current limiting resistor 160. Thus, any fault current from any of the three-phase inputs will flow through the single resistor 160. By appropriately selecting the resistance or impedance value for the resistor function 160, fault currents can be limited to acceptable levels, for example 5 amperes, assuring that no arc damage will take place between the inductive components 92a–92i and their metal enclosure. In effect, any of the electromagnetic pumps exhibiting such a controlled fault current may be maintained in operation until maintenance can be performed. In the event the reactor protection system (RPS) 176 functions to open the circuit breaker array 166, synchronous machine 32 remains the only source of power within the safety related primary heat transport system. Since the RPS 176 has removed any communications with the resistor 160, any single point faults at the inductive components of pump 80 are now isolated and current through such a fault does not have a return path to synchronous machine 32. Thus, all energy generated by the synchronous machine 32 will be used to support the flow coast down as opposed to feeding the ground fault.

Figure 7:
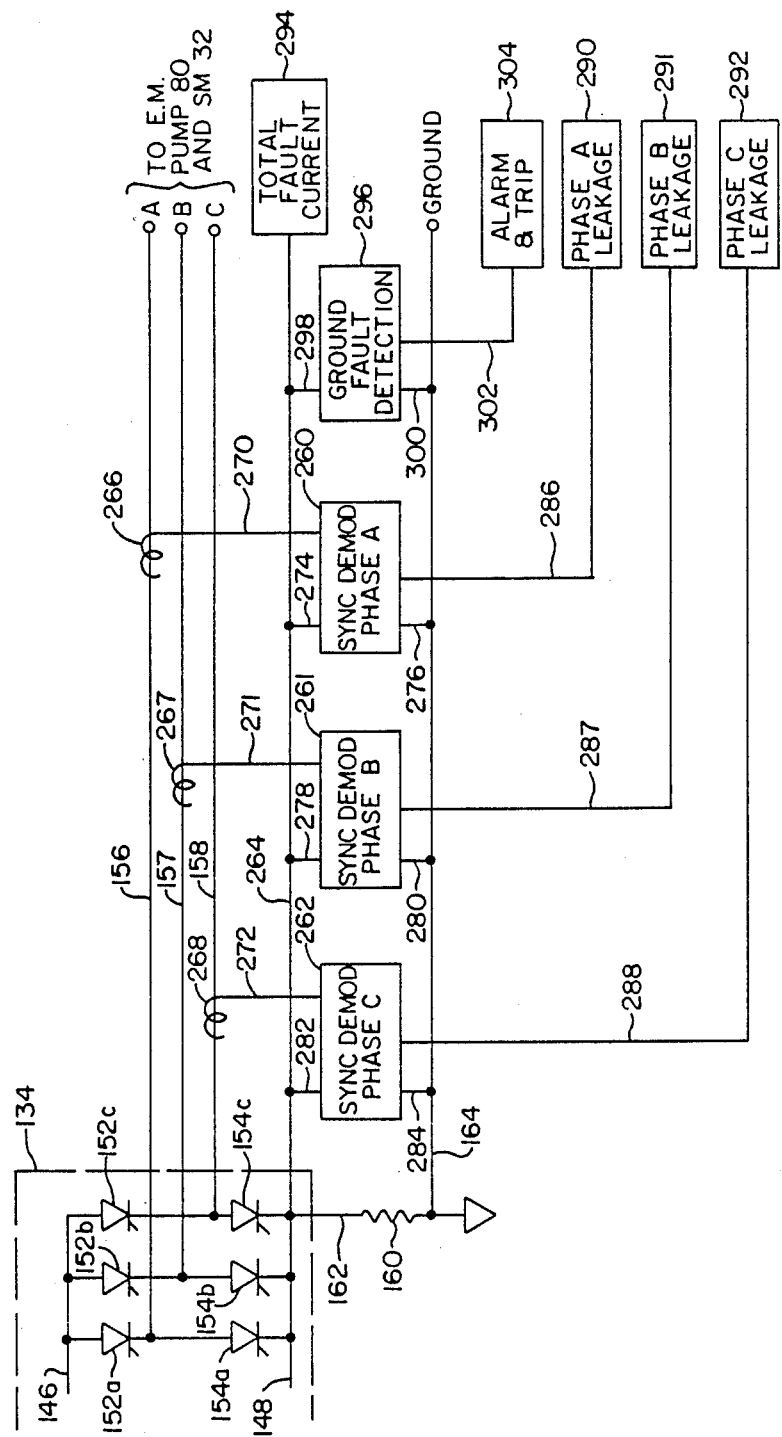
FIG. 7 is a block schematic diagram of monitoring features of the instant invention.

It is important that such fault conditions be evaluated by plant operating personnel. In FIG. 7, three, phase designated synchronous demodulators are represented at blocks 260–262 which function to determine the amount of fault induced current within each of the respective phases A through C. These demodulators are seen to detect current within each of the phase lines 156–158 by detectors such as current transformers shown, respectively, at 266–268. The outputs of these current transformers 266–268 are tapped by respective lines 270–272 leading to the noted demodulator networks 260–262. Additionally, the networks 260–262 are coupled to monitor overall voltages extant at resistor 160 representing total fault currents or conditions. For example, demodulator 260 is coupled between ground line 164 and d.c. bus 148 via line 264 by lines 274 and 276; demodulator network 261 monitors that same voltage as represented by line taps 278 and 280; and demodulator network 262 carries out the same monitoring function by tap lines 282 and 284. The outputs of demodulator networks 260–262 are presented via respective lines 286–288 to perceptible readouts shown, respectively, at 290–292 providing phase designated fault current information to plant operational personnel.

Total fault current also may be evaluated by the monitoring system. In this regard, that parameter is shown by block 294 as coupled with line 264.

Finally, a ground fault detection circuit may be provided as represented at block 296. The ground fault on a total basis for all three phases is detected by monitoring the resultant voltage across resistor 160 as is present across corresponding lines 164 and 264. This monitoring with respect to the detection circuit of block 296 is represented at tap lines 298 and 300. As fault current reaches a predetermined alarm level, conventional threshold circuitry may be provided, as represented at line 302 and block 304, to alarm operating personnel by some perceptible arrangement, visual and/or audio, of the condition at hand. Further, the fault current may exceed a trip designated level resulting in the carrying out of emergency shut-down procedures.

Figure 8:
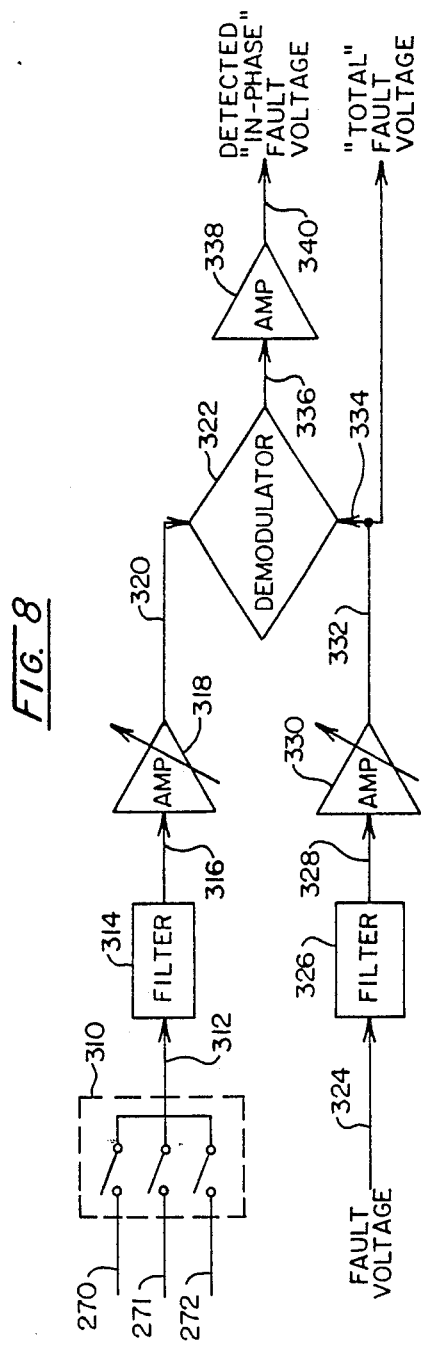
FIG. 8 is a schematic diagram of a synchronous demodulator which may be employed with the monitoring features of FIG. 7.

Referring to FIG. 8, an arrangement for carrying out the synchronous demodulation for the polyphase control and drive to pump 80 as described at blocks 260–262 in FIG. 7 is portrayed. In the embodiment of the figure, rather than separate discrete synchronous detector circuits, one such circuit is provided in conjunction with a selection of a particular phase as tapped from lines 270–272. Such selection is provided by a switch represented within boundary 310. The selected phase current output from the switching function 310 is directed, as represented by line 312, to a filter 314. Filter 314 functions to remove spurious noise and like signals. The thus-filtered output then is presented, as represented at line 316, to the input of a variable gain amplifier represented at 318. Amplifier 318 adjusts the level of the resultant signal for the analog form of synchronous detection set forth. The level adjusted signal then is presented, as represented at line 320 to the input of a demodulator represented at block 322.

Simultaneously, the voltage across resistor 160 as developed, in turn, across lines 164 and 264 is presented as represented by arrowed line 324 to a filter stage represented at block 326. As before, filter 326 functions to remove spurious noise and the like and the thus-filtered signal, which is a voltage representing the total cumulative fault current, is presented as represented at line 328 to a variable gain amplification stage 330. As before, the level of the signal is adjusted at stage 330 for presentation in consonance with the level at line 320 at lines 332 and 334 for assertion at the demodulator stage 322. From stage 322, as represented at line 336, a signal voltage representing a discrete selected phase current is developed which is amplified by an isolating amplifier stage 338 and presented for readout in suitable form as represented at line 340. The signal evolved from line 342 and directed to line 334 also may be employed to provide a total fault current output as discussed in conjunction with block 294.

As is apparent, fault current detection and control according to the invention also may be applied to power conditioner facility 134, RPS breaker 166, coupling cables and synchronous machine 32. Also, it may be observed that dedicated line 164 serves to couple each. An electrical grounding system is developed with the invention which provides the minimum requirements for protection of life and property as specified by the National Electrical Code of the U.S.A. (ANSI/NFPA 70-1981) sponsored by the National Fire Protection Assocation.

Since certain changes may be made in the above-described system, method, and apparatus without departing from the scope of the invention herein involved, it is intended that all matter contained in the description thereof or shown in the accompanying drawings shall be interpreted as illustrative and not in a limiting sense.

I claim:

1. In a nuclear power plant of a variety wherein a reactor is provided including a reactor vessel retaining a liquid metal coolant, a reactor core and a polyphase electromagnetic pump having selectively, excitable flux generating components insulatively enclosed within the walls of an enclosure, an a.c. plant power supply, means defining a facility ground, a plant control system and a reactor protection system for effecting safety related control over said reactor, a system for controlling electrical faults, comprising:

power source means inductively coupled with said plant power supply for deriving an electrically isolated electrical power source;

conditioner means coupled with said isolated electrical power source for providing select phase outputs effecting polyphase energization of said flux generating components;

ground fault control conductor means coupled between said pump and said isolated electrical power source for providing a fault current return thereto in the presence of a ground fault between a said flux generating component and said enclosure wall; and current limiting resistor means coupled intermediate said fault control conductor means and said isolated electrical power source and having an impedance of value selected to limit said fault current to a predetermined value selected to assure the integrity of said enclosure walls.

2. The system of claim 1 including monitoring means responsive to instantaneous current values of a said select phase output of said conditioner means and to voltages witnessed across said resistor means for deriving a monitoring output corresponding with the value of said fault current within said select phase.

3. The system of claim 1 including fault detection means responsive to voltages witnessed across said resistor means for providing a perceptible alarm output in response thereto.

4. The system of claim 1 including means for coupling said resistor means with said facility electrical ground.

5. The system of claim 1 including:

synchronous machine means having an electrically conductive frame and a rotation sustaining inertial device coupled in electrically driven relationship with said controller means phase outputs and in electrical parallel relationship with said pump flux generating components, for effecting coastdown energization of said pump flux generating components to maintain adequate terminal power to liquid metal coolant ratio for a countdown interval, in the event of termination of said controller means select phase outputs;

safety qualified circuit breaker means having a frame and responsive to said reactor protection system for effecting the open circuit termination of said controller means select phase outputs;

regulator means responsive in the absence of said controller means phase outputs for controlling said synchronous machine means coastdown energization to maintain said ratio; and said ground fault control conductor means is coupled with said synchronous machine frame.

6. The system of claim 5 in which said ground fault conductor means is coupled with said circuit breaker means frame.

7. In a nuclear power plant of a variety wherein a reactor is provided including a reactor vessel retaining a liquid metal coolant, a reactor core and a polyphase electromagnetic liquid metal circulating pump submerged within said liquid metal, said pump having energizable flux generating components insulatively enclosed within the walls of a protective chamber, an a.c. plant power supply, a facility electrical ground, a synchronous machine electrically coupled in parallel relationship with said pump and including a rotation sustaining inertial device, a controller energized from said power supply for effecting polyphase energization of said flux generating components and the simultaneous parallel energization of said synchronous machine, a plant control system for controlling said controller and a reactor protection system for effecting safety related control over said reactor; a fault control circuit comprising:

isolation transformer means coupled intermediate said a.c. plant power supply and said controller for providing an electrically isolated power source to said controller;

said controller comprising rectifier means for deriving a d.c. output and inverter means under control of said plant control system for converting said d.c. output to a select polphase a.c. output for energizing said pump flux generating components and said synchronous machine; and ground fault control conductor means coupled between said pump and said electrically isolated power source for providing an electrical fault current return thereto from said pump.

8. The fault control circuit of claim 7 including current limiting resistor means coupled intermediate said fault control conductor means and said power source and having an impedance value selected to limit said electrical ground fault current to a predetermined maximum value selected to assure the integrity of said pump protective chamber.

9. The fault control circuit of claim 7 in which said fault control conductor means is coupled with said synchronous machine.

10. The fault control circuit of claim 8 including:

safety qualified circuit breaker means having a frame and responsive to said reactor protection system for effecting the open circuit termination of said polyphase energization of said pump flux generating components and said synchronous machine;

said synchronous machine subsequently effecting polyphase energization of said pump flux generating components for a coastdown interval derived by said rotation sustaining inertial device; and said ground fault conductor means is coupled with said circuit breaker means frame.

11. The fault control circuit of claim 7 including:

resistor means coupled intermediate said ground fault control conductor means and said power source and exhibiting monitoring voltages corresponding with said fault current; and monitoring means responsive to instantaneous current values of a select phase of said controller polyphase energization and to said monitoring voltages for deriving a output corresponding with the value of said fault current within said select phase.

12. The fault control circuit of claim 11 in which said monitoring means includes a synchronous demodulator for the identification of said select phase.

13. The fault control circuit of claim 7 including:

resistor means coupled intermediate said ground fault control conductor means and said power source and exhibiting monitoring voltages thereacross corresponding with said fault current; and electrical ground fault detection means responsive to said monitoring voltages for providing a perceptible alarm output in response thereto.

14. The fault control circuit of claim 13 in which said resistor means is selected having an impedance value selected to limit said fault current to a predetermined maximum value selected to assure the integrity of said pump protection chamber.

15. In a nuclear power plant of a variety wherein a reactor is provided including a reactor vessel retaining a liquid metal coolant, a reactor core and an electromagnetic pump having a plurality of inductive windings insulatively retained within the electrically conductive wall of an enclosure, means defining a facility electrical ground, an a.c. plant power supply and a plant control system; the method for controlling electrical ground fault current between a said inductive winding and said walls comprising the steps of:

providing an electrically isolated power source by inductive coupling with said plant power supply;

rectifying said power source to provide an isolated d.c. power source;

providing an inverter powered from said isolated d.c. power source under the control of said plant control system for selectively energizing said inductive windings;

providing a fault control conductor electrically connected with said pump enclosure wall and extending as an electrical return for ground fault current to said inverter; and providing an electrical resistance between said conductor and said isolated inverter having an impedance selected to limit said fault current below a predetermined value limiting arc damage at any said electrical ground fault location.

16. The method of claim 15 including the step of monitoring voltages across said electrical resistance and determining therefrom the extent of fault current within said control conductor.

17. The method of claim 15 including the steps of:

monitoring the voltages across said electrical resistance;

monitoring select said current energizing said inductive windings; and deriving the value of fault current from said monitored voltage and monitored current.

* * * * *